United States Patent
Shoji et al.

(10) Patent No.: US 6,560,266 B2
(45) Date of Patent: May 6, 2003

(54) DISTRIBUTED FEEDBACK SEMICONDUCTOR LASER

(75) Inventors: Hajime Shoji, Machida (JP); Hirohiko Kobayashi, Machida (JP); Tsutomu Ishikawa, Isehara (JP)

(73) Assignee: Fujitsu Limited, Kawasaki (JP)

( * ) Notice: Subject to any disclaimer, the term of this patent is extended or adjusted under 35 U.S.C. 154(b) by 33 days.

(21) Appl. No.: 09/964,614

(22) Filed: Sep. 28, 2001

(65) Prior Publication Data

US 2002/0039375 A1 Apr. 4, 2002

(30) Foreign Application Priority Data

Oct. 3, 2000 (JP) ............................... 2000-303326

(51) Int. Cl.$^7$ .............................................. H01S 5/187
(52) U.S. Cl. .......................................... 372/96; 372/46
(58) Field of Search ................................ 372/45, 46, 96

(56) References Cited

U.S. PATENT DOCUMENTS

| | | | |
|---|---|---|---|
| 5,452,318 A | | 9/1995 | Makino et al. |
| 6,381,258 B1 | * | 4/2002 | Takei et al. ............... 372/96 |
| 6,400,744 B1 | * | 6/2002 | Capasso et al. ........... 372/96 |

FOREIGN PATENT DOCUMENTS

JP        8-242035        9/1996

* cited by examiner

Primary Examiner—James Davie
(74) Attorney, Agent, or Firm—Armstrong, Westerman & Hattori, LLP

(57) ABSTRACT

A DFB laser in which a thickness of an active layer changes periodically and a greater part of current injected from external sides is selectively injected into the thick regions (projected regions) of the active layer. Therefore, the ratio of the gain coupling to the refractive index coupling can be further increased, and a threshold current can be lowered, and stability of single mode oscillation can also be improved.

16 Claims, 10 Drawing Sheets

Prior Art
Fig. 1 (a)
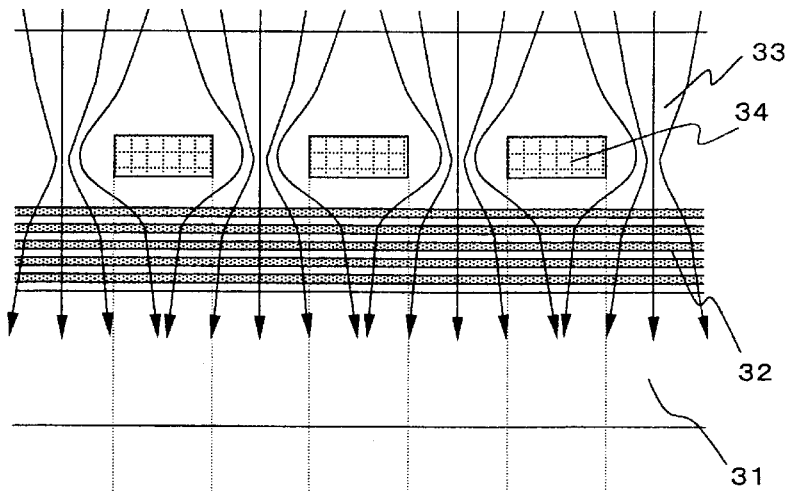
Fig. 1 (b) Gain
Fig. 1 (c) Refractive Index
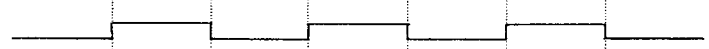
Fig. 1 (d) Optical Field
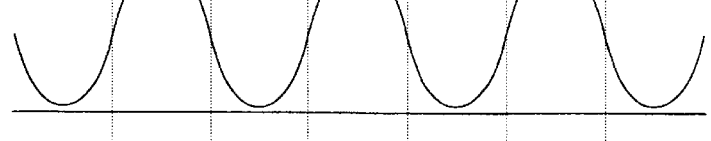

Prior Art
Fig. 2 (a)
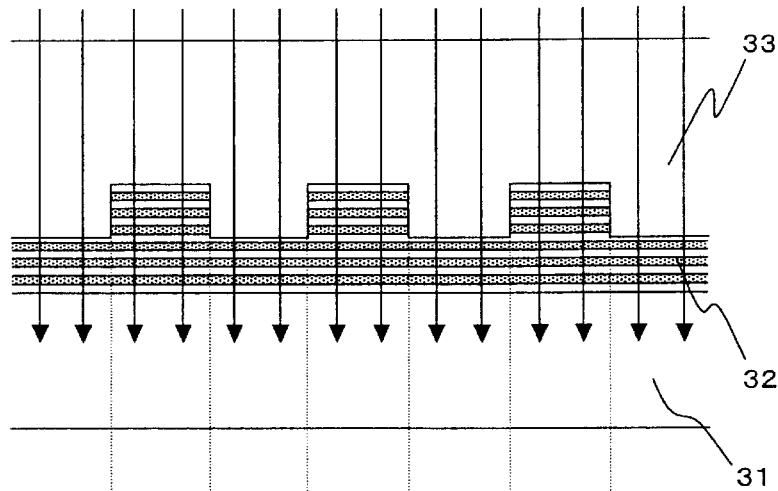
Fig. 2 (b) Gain
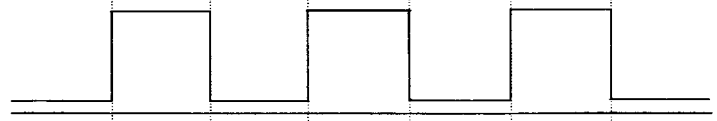
Fig. 2 (c) Refractive Index
Fig. 2 (d) Optical Field
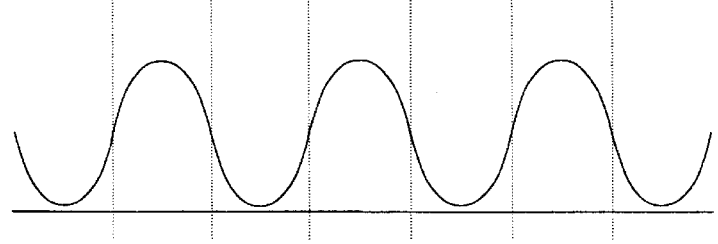

Prior Art

Fig. 4 (b) Gain

Fig. 4 (c) Refractive Index

Fig. 4 (d) Optical Field

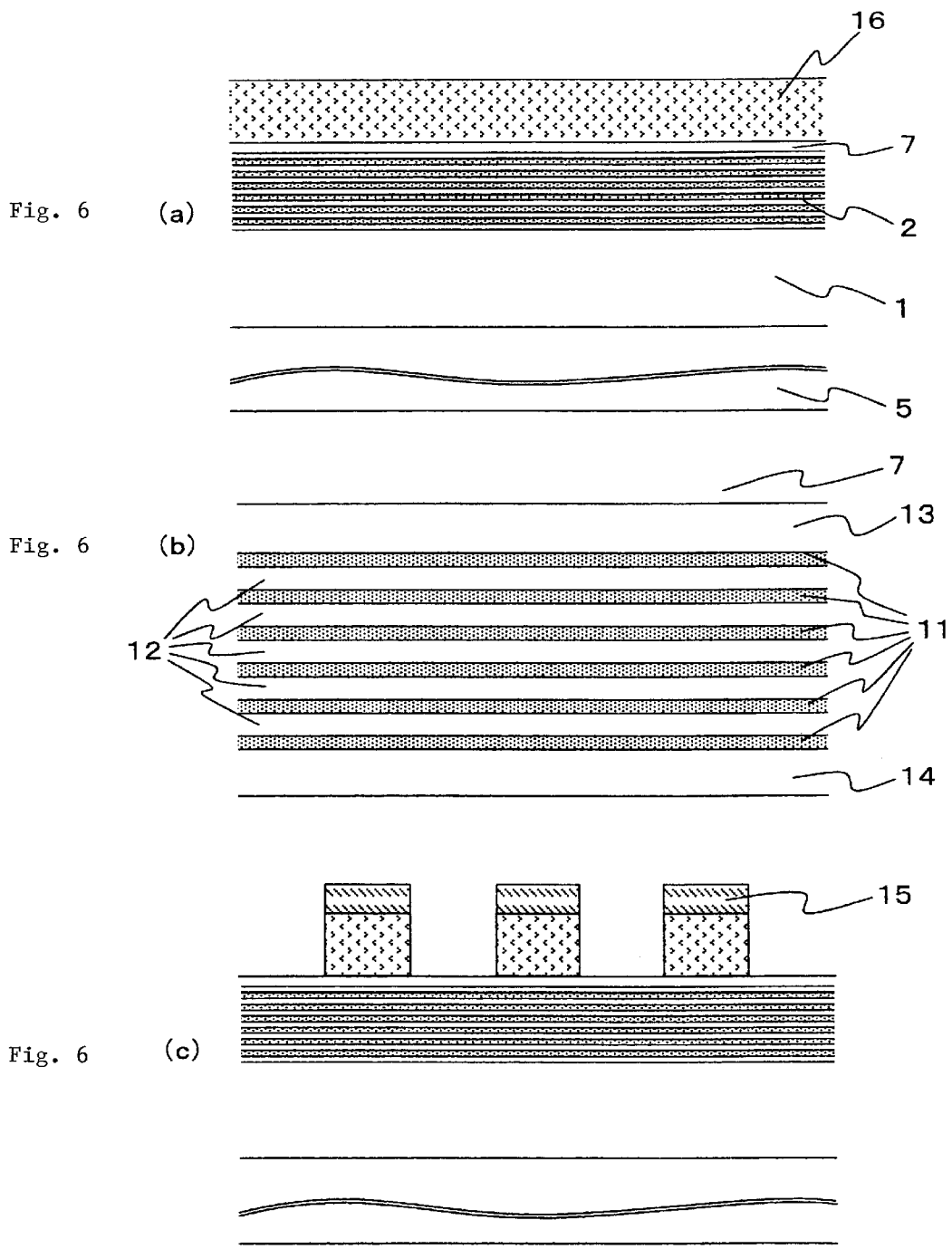

DISTRIBUTED FEEDBACK SEMICONDUCTOR LASER

FIELD OF THE INVENTION

The present invention relates to a distributed feedback semiconductor laser comprising an active layer sandwiched between the upper side and lower side cladding layer and a diffraction grating formed along said active layer. More specifically, the present invention relates to a distributed feedback semiconductor laser characterized by its structure to enable stable oscillation in the single mode and in addition enable high output operation.

DESCRIPTION OF THE RELATED ART

In recent years, trunk line optical communication systems that enable transmission of a large amount of data for a long distance have been established. Therefore, a light source of such optical communication is requested to satisfy both excellent single wavelength oscillation as well as high output operation.

For a light source to realize the above requested characteristics, a distributed feedback semiconductor laser (hereinafter, referred to as DFB laser), particularly a ¼ phase-shifted DFB laser has been used. This ¼ phase-shifted DFB laser is provided with a diffraction grating having a projected and recessed shape along an active layer and having a ¼ phase shift region near the center of the laser resonator. The active layer is formed within an optical waveguide in the resonator.

However, in the refractive index coupled DFB laser explained above, it is difficult to simultaneously attain stability of single mode oscillation and high output operation, and resistance for the reflected beam returning from external sides is rather small. Therefore, a gain coupled DFB laser has been proposed as a DFB laser to overcome the problems of the refractive index coupled DFB laser explained above, and development of such DFB laser is now continued.

In the gain coupled DFB laser, mode selectivity of an oscillation wavelength is enhanced by adding a periodical perturbation of the gain in the guiding direction of an optical beam. Therefore the stable single mode oscillation is possible even if there is no phase shift region and no anti-reflection film at the end surface of the resonator in the refractive index coupled DFB laser.

Moreover, it is experimentally confirmed that a large resistance is also assured for the reflected beam returning from the external sides.

Moreover, since stable single mode oscillation is possible without any anti-reflection films, the anti-reflection film and the high-reflection film can be provided at both end surfaces of the laser. Therefore, high output operation can be realized.

Here, a first conventional art gain coupled DFB laser that can be assumed to have relationship with the present invention will be explained with reference to FIGS. 1(a)–1(d).

FIG. 1(a) is a cross-sectional view of the gain coupled DFB laser of the first conventional art along the guiding direction of an optical beam. In this figure, numeral 31 designates an n-type InP cladding layer; 32, an active layer comprising a multiple quantum well (MQW); 33, a p-type InP cladding layer; and 34, n-type InP current blocking portions. A curve given the arrow mark schematically indicates the flow of a current. FIGS. 1(b) to 1(d) respectively illustrate distributions of gain, refractive index and optical field intensity corresponding to the cross-sectional view of FIG. 1(a) along the guiding direction of an optical beam.

In the DFB laser of FIGS. 1(a)–1(d), the n-type portions 34 are periodically formed within the p-type cladding layer 33. The n-type portions 34 keep a constant distance from the active layer 32 formed in the uniform thickness. Since this n-type portion 34 is embedded in the p-type layer 33, it plays a role of the current blocking layer.

Since a current is pinched in the regions between respective current blocking portions with the effect of this n-type current blocking portion 34, as schematically illustrated in FIG. 1(a), distribution of density of the current flowing into the active layer 32 is lowered in the regions of the active layer just under the current blocking portions 34 and is raised, on the contrary, in the regions where there are no current blocking portions 34 thereon.

This is the reason why the gain of the DFB laser of FIG. 1 is periodically distributed as illustrated in FIG. 1(b). Therefore gain coupling occurs and the laser starts to operate as the gain coupled DFB laser.

Next, a second conventional art gain coupled DFB laser that is assumed to have relationship with the present invention will be explained with reference to FIGS. 2(a)–2(d).

FIG. 2(a) is a cross-sectional view of the gain coupled DFB laser of the second conventional art along the guiding direction of an optical beam. The elements like those of FIG. 2 are designated with the like reference numerals. As in the case of FIG. 2, FIGS. 2(b) to 2(d) respectively illustrate distributions of gain, refractive index and optical field intensity corresponding to the cross-sectional view of FIG. 2(a) in the guiding direction of an optical beam.

In the DFB laser of FIG. 2, the active layer itself is periodically etched to form periodical projected and recessed shapes as illustrated in FIG. 2(a). Therefore, in this shape, thickness of the active layer is periodically changed along the guiding direction of an optical beam. In the region (projected region) where the active layer is thick, the generated gain is larger than that of the thin region (recessed region).

Accordingly, since the periodical gain distribution is formed as illustrated in FIG. 2(b) in the DFB laser of FIG. 2, gain coupling occurs and the laser starts to operate as the gain coupled DFB laser.

A third conventional art gain coupled DFB laser that is assumed to have the relationship with the present invention will be explained with reference to FIG. 3.

FIG. 3 is a cross-sectional view of the gain coupled DFB laser of the third conventional art along the guiding direction of an optical beam. The elements like those in FIGS. 1(a)–1(d) and FIGS. 2(c)–2(d) are designated with like reference numerals. Numeral 35 designates embedded portions.

The DFB laser of FIG. 3 has a structure almost similar to the DFB laser of the second conventional art of FIGS. 2(c)–2(d). However, it is different only in the point that the recessed region of the active layer 32 having periodical projected and recessed shapes is embedded with p-type InGaAsP. This p-type InGaAsP is the quaternary compound semiconductor material having a band gap which is smaller than that of the p-type InP cladding layer 33, namely the refractive index which is larger than that of such material.

Moreover, in the DFB laser of FIG. 3, distribution of the refractive index in the guiding direction of an optical beam is kept small by adjusting a composition of the InGaAsP embedded portions 35 so that the refractive index of the embedded portions 35 becomes close to the average refractive index of the active layer 32.

However, the gain coupled DFB laser structures of the first to third conventional arts explained above respectively have the following problems.

First, the DFB laser of the first conventional art has a problem that it is actually difficult to increase the ratio of gain coupling to refractive index coupling. This will cause a generation of a fluctuation in the single wavelength characteristic of the laser oscillation thereby lowering the stability of the single mode oscillation.

Namely, in the process of forming a groove for current blocking portions 34 by etching the p-type cladding layer 33, it is required to keep a constant margin for the remaining thickness of the cladding layer 33 in order to prevent the active layer 32 from being etched. Therefore, it is actually difficult to reduce the distance between the current blocking portion 34 and the active layer 32.

Therefore, the pinching effect of currents by the current blocking portions 34 becomes insufficient and a current disperses into the regions just under the current blocking portions 34 as illustrated in FIG. 1(a). Accordingly, it is impossible to provide a sufficient difference in injected current density between the regions where there are no current blocking portions 34 thereon and the regions just under these current blocking portions. Therefore, sufficient gain distribution cannot be formed in the guiding direction of an optical beam and thereby a large element of gain coupling cannot be obtained.

Moreover, in the DFB laser of the first conventional art, in addition to the amount of gain coupling, the refractive index coupling also exists in such a degree that cannot be neglected.

Namely, as explained above, a larger amount of current is injected into the regions of the active layer where there are no current blocking portions 34 thereon in comparison with the regions just under the current blocking portions. Thereby the carrier density becomes larger in the regions where there are no current blocking portions 34 thereon.

As a result, the refractive index in the regions where there are no current blocking portions 34 becomes smaller than that in the regions just under the current blocking portions due to the plasma effect. Therefore, as illustrated in FIG. 1(c), since the periodical distribution of the refractive index is also generated simultaneously with the periodical distribution of the gain, the refractive index coupling is also generated simultaneously.

Therefore, in the DFB laser of the first conventional art, it is difficult to realize larger gain coupling to the refractive index coupling.

Moreover, the DFB laser of the first conventional art has a problem that the oscillation efficiency for the injected currents cannot be raised and thereby a threshold current increases.

Namely, in general a standing wave of a optical field in the laser resonator is generated to a large degree within the regions having higher refractive index. Therefore, when the refractive index distribution exists, it is preferable that the phase of a refractive index distribution is coincident with the phase of a gain distribution in order to realize high efficiency oscillation with equal current injection.

However, as illustrated in FIGS. 1(b), 1(c), the gain distribution and refractive index distribution are generated in the inverse phases in the gain coupled DFB laser of the first conventional art. Therefore, the amplification efficiency in the optical field in the resonator is rather bad and the oscillation efficiency for the injected currents cannot be increased. Therefore, it is impossible to avoid an increase of the threshold current.

Next, the DFB laser of the second conventional art has a problem that a threshold current increases since current injection efficiency into the thick regions of the active layer becomes lower.

Namely, in the case of the gain coupled DFB laser of the second conventional art, since the recessed region of the active layer 32 is embedded with the p-type InP layer that is the same material as the p-type cladding layer 33, a potential barrier for a hole is not generated over the recessed region of the active layer 32. Thereby a hole current injected from external sides is ordinarily injected, in almost the same rate, into the thick and thin regions of the active layer having the projected and recessed shape.

In general, since a current injected into the thin regions (recessed regions) of the active layer almost does not contribute to the laser oscillation, approximately 50% of the injected currents is in principle wasted without any contribution to the laser oscillation. Therefore, in the DFB laser of the second conventional art, current injection efficiency into the thick regions contributes substantially to the lowering of the oscillation and a threshold current inevitably becomes large.

Moreover, the refraction index coupling cannot be neglected in addition to the gain coupling in the DFB laser of the second conventional art, as in the case of the first conventional art. Therefore, a problem arises that it is very difficult to sufficiently enlarge the ratio of gain coupling to refractive index coupling. Thereby, fluctuation is generated in the single wavelength characteristic of the laser oscillation and the stability of the single mode oscillation will be lowered.

Namely, the InP cladding layer having a band gap that is larger than that of the active layer, namely having the smaller refractive index, is embedded on the recessed region of the active layer that is periodically etched. Therefore the gain distribution is obtained as explained above and simultaneously the periodical distribution of the refractive index is also generated as illustrated in FIG. 2(c). Thereby a large element of refractive index coupling is also generated.

Particularly, in the case of the gain coupled DFB laser of the second conventional art, when the recessed region of the active layer 32 is set deeper to increase a difference of the film thickness between the thick and thin regions of the active layer 32 and to attain a large element of the gain coupling, the InP layer having the refractive index that is smaller than the average refractive index of the active layer 32 is embedded on the recessed region by amounts proportional to the increase of the depth of the recessed region. Thereby the refractive index coupling also simultaneously becomes large.

Therefore, in the DFB laser of the second conventional art, sufficiently large ratio of the gain coupling to the refractive index coupling cannot be obtained.

Meanwhile, in the DFB laser of the third conventional art, the setting is made so that the amplitude of the refractive index distribution generated in the guiding direction of an optical beam becomes small by adjusting a composition of the InGaAsP embedded portions formed on the recessed region of the active layer. Therefore the refractive index coupling can be reduced to a small value that can be neglected for the gain coupling. Therefore, a certain improvement is apparent in this point.

However, the DFB laser of the third conventional art also has a problem that the threshold current becomes large because current injection efficiency into the thick regions of the active layer becomes lower, as in the case of the second conventional art.

Namely, the recessed region of the active layer 32 is embedded with the p-type semiconductor layer of the same conductivity type as the p-type InP cladding layer 33, particularly with the p-type InGaAsP layer 35 having a band gap that is smaller than that of the p-type InP cladding layer. Therefore any potential barrier for a hole is not generated over the recessed regions and, on the contrary, the dip of potential is formed.

Therefore, since a hole current injected from external sides is injected, in a larger ratio, into the thin regions (recessed region) than the thick regions (projected region) of the active layer 32 having projected and recessed shape, about 50% or more of the injected current is wasted without any contribution to the laser oscillation.

Therefore, in the DFB laser of the third conventional art, since a current injection efficiency into the thick regions contributes substantially to the lowering of the oscillation, the threshold current becomes larger.

SUMMARY OF THE INVENTION

The present invention has been proposed considering the problems explained above. It is a general object of the present invention to provide a structure of a gain coupled DFB laser that assures a larger ratio of the gain coupling to refractive index coupling and attains a lower threshold current by generating gain coupling and refractive index coupling in-phase.

Another and a more specific object of the present invention is to provide a DFB laser comprising: a first cladding layer; a second cladding layer having a conductivity type opposite to that of said first cladding layer; an active layer sandwiched between said first cladding layer and said second cladding layer, having periodically projected and recessed surfaces and having thickness which periodically changes, and; current blocking portions formed on said recessed surfaces of said active layer for pinching a current flowing into said first and second cladding layers in order to selectively guide the current through the projected surfaces of said active layer.

With this structure, the thickness of the active layer can be changed periodically, and a greater part of a current injected from external sides can be selectively injected to the thick regions (projected regions) of the active layer, and the amount of a current to be injected to the thin regions (recessed regions) of the active layer can be extremely reduced.

Therefore, since the gain coupling to the refractive index coupling can be increased more than that of the conventional arts, stability of the single mode oscillation of the laser can further be improved. Moreover, oscillation efficiency for the injected current can be improved and thereby a threshold current can also be lowered than that of the conventional arts.

BRIEF DESCRIPTION OF THE DRAWINGS

FIGS. 1(a)–1(d) are cross-sectional views in the direction along the guiding direction of an optical beam of the gain coupled DFB laser of the first conventional art.

FIGS. 2(a)–2(d) are cross-sectional views in the direction along the guiding direction of an optical beam of the gain coupled DFB laser of the second conventional art.

FIGS. 6(a)–6(c) are first cross-sectional views along the guiding direction of an optical beam for explaining the manufacturing process of the DFB laser according to the first embodiment of the present invention.

DETAILED DESCRIPTION OF THE PREFERRED EMBODIMENT

Figure 3:
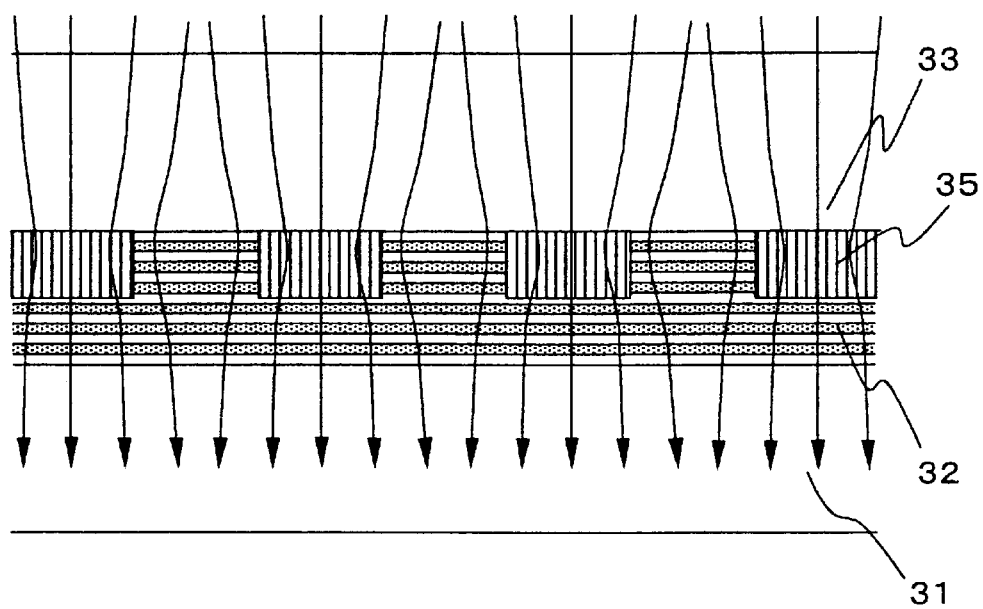
FIG. 3 is a cross-sectional view in the direction along the guiding direction of an optical beam of the gain coupled DFB laser of the third conventional art.

FIGS. 4(a) to 4(d) are principle explanatory diagrams of the present invention. FIG. 4(a) is a cross-sectional view of the gain coupled DFB laser of the present invention along the guiding direction of an optical beam. In this figure, numeral 1 designates a first cladding layer having a first conductivity type; 2, an active layer; 3, a second cladding layer having a second conductivity type, 4, current blocking portions. A curve given the arrow mark schematically indicates the flow of current.

Moreover, FIGS. 4(b) to 4(d) respectively illustrate distributions of gain, refractive index and optical field intensity in the guiding direction of an optical beam.

The means for solving the problems of the present invention will be explained below with reference to FIGS. 4(a) to 4(d).

(1) According to one aspect of the present invention, the DFB laser comprises an active layer 2 that is sandwiched by a first cladding layer 1 and a second cladding layer 3 and that has periodical projected and recessed shapes at the surface in the side of the second cladding layer 3 to change periodically the thickness thereof, and current blocking layer portions 4 that are formed on the recessed surfaces of the active layer 2 to selectively guide a current to a projected region of the active layer 2 by pinching such current flowing through the second cladding layer 3.

With this structure, the thickness of the active layer changes periodicaly in the guiding direction of an optical beam and a greater part of the injected currents is selectively injected into the thick regions (projected region) of the active layer as indicated by the arrow marks of FIG. 4(a) on the occasion of injecting currents from external sides into the active layer. Thereby, the amount of current injected into the thin regions (recessed region) of the active layer can be reduced to an extremely small value.

Therefore, it is possible to further increase the gain of the thick regions (projected region) of the active layer and further decrease the gain of the thin regions (recessed region). Thereby the amplitude of gain distribution in the guiding direction of an optical beam can be set larger than that of the conventional arts and the element of gain coupling that is larger than that of the conventional arts can be attained, as illustrated in FIG. 4(b) and FIG. 4(c).

Accordingly, since it is possible to set the ratio of the gain coupling to the refractive index coupling larger than that of the conventional arts, stability of the single mode oscillation of the laser can be much improved.

Moreover, a greater part of the currents injected from the external sides can be selectively injected, much more than ever, into the projected regions of the active layer, and the phase of the gain distribution can be set in-phase with the refractive index distribution. Thereby, the optical field in the resonator can be amplified efficiently.

Therefore, oscillation efficiency for the injected currents can be improved and a threshold current can also be lowered than that of the conventional arts.

(2) According to another aspect of the present invention, the DFB laser comprises current blocking portions 4 comprised of a semiconductor layer having a conductivity type opposite to that of the second cladding layer 3.

With this structure, the present invention enables, unlike the DFB lasers of the second and third conventional arts explained above, generation of a potential barrier for majority carriers of the second cladding layer at the interface between the second cladding layer 3 and the current blocking portions 4.

On the contrary, a potential barrier is never generated at the interface between the second cladding layer 3 and the thick regions (projected regions) of the active layer 2 and only the slope of potential exists for the majority carriers. Therefore, a current consisting of majority carriers of the second cladding layer can be blocked with the potential barrier and thereby a current can be guided to the thick regions (projected regions) of the active layer.

Therefore, a current injected into the second cladding layer from external sides can be effectively injected into the thick regions (projected regions) of the active layer.

(3) According to another aspect of the present invention, the DFB laser further comprises embedded portions having a conductivity type opposite to that of current blocking portions 4 and formed, between current blocking portions 4 and the thin regions of the active layer 2, on the recessed surfaces of the active layer 2.

With this structure, a thyrist or structure can be formed of the four layers of the second cladding layer, the current blocking portion, the embedded portion and the first cladding layer through the thin region of the active layer.

In general, the thyrist or structure has a high electric resistance which almost does not allow current to flow, and that can always maintain an inverse bias junction of a diode until a certain voltage is generated across the thyrist or. Therefore, a more effective current blocking effect can also be attained.

Specially, since an inverse bias junction of a diode is formed at the interface between the current blocking portions and the embedded portions, current consisting of majority carriers of the second cladding layer can be blocked effectively with the potential barrier due to the inverse bias junction.

Therefore, current injected into the second cladding layer from external sides can be injected effectively into the thick regions (projected regions) of the active layer with higher efficiency.

(4) According to another aspect of the present invention, the DFB laser comprises current blocking portions 4 comprised of a semiconductor layer having a band gap smaller than that of the first cladding layer and the second cladding layer, namely having a refractive index larger than that of such cladding layers.

With this structure, the average refractive index of the semiconductors embedded in the recessed regions can be enlarged. Thereby, the difference of average refractive indices of the semiconductors embedded on the recessed regions of the active layer and the semiconductors included in the projected regions of the active layer can be reduced. Therefore, the amplitude of the refractive index distribution in the guiding direction of an optical beam can be reduced and the refractive index coupling is also reduced.

Accordingly, the ratio of the gain coupling to the refractive index coupling can be increased and thereby the stability of the single mode oscillation of the laser can further be improved.

Particularly, in the DFB laser of the present invention, a composition of semiconductors forming the current blocking portions 4 can be adjusted to substantially equalize the average refractive index of the semiconductors embedded on the recessed regions to that of the projected regions.

In this case, the difference between average refractive indices of the semiconductors embedded on the recessed regions of the active layer and semiconductors included in the projected region of the active layer disappears. Therefore, the refractive index coupling is substantially eliminated, and the ratio of the gain coupling to the refractive index coupling can be enlarged. Thereby stability of the single mode oscillation of the laser can further be improved.

(5) According to another aspect of the present invention, the DFB laser comprises current blocking portions 4 comprised of a semiconductor layer having a band gap that is smaller than that corresponding to a Bragg wavelength which is determined by a period of distribution of projected and recessed regions of the active layer 2.

With this structure, current blocking portions can be comprised of a material for absorbing the light having oscillation wavelength of the laser. Therefore, the gain can selectively be reduced in the thin regions (recessed regions) of the active layer just under the current blocking portions.

Therefore, since it is possible to further enlarge the amplitude of the gain distribution in the guiding direction of an optical beam, the ratio of the gain coupling to the refractive index coupling can further be increased. Thereby, the stability of the single mode oscillation of the laser can further be improved.

Figure 5:
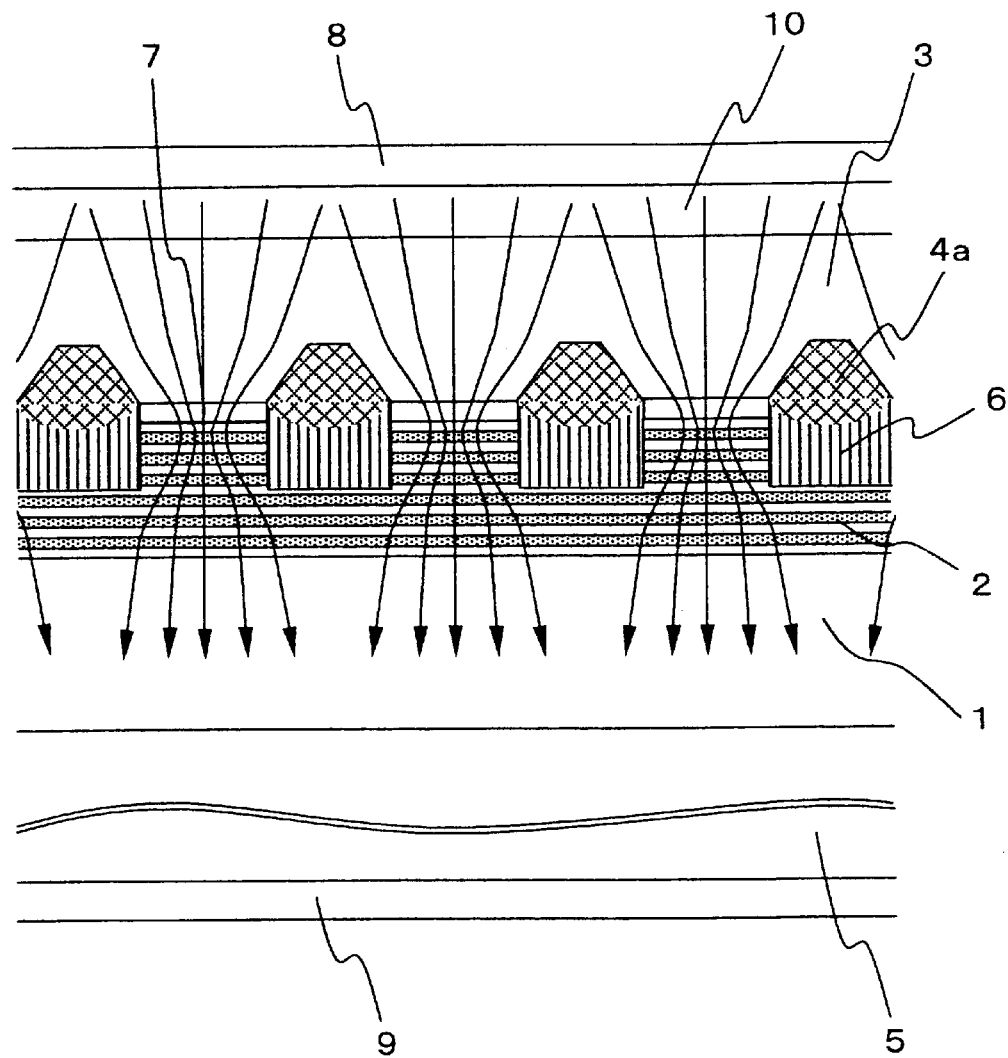
FIG. 5 is a cross-sectional view of the gain coupled DFB laser along the guiding direction of an optical beam according to the first embodiment of the present invention.

FIG. 5 is a schematic diagram illustrating a first embodiment of the present invention and a cross-sectional view in the guiding direction of an optical beam of the gain coupled DFB laser as the first embodiment.

Figure 4:
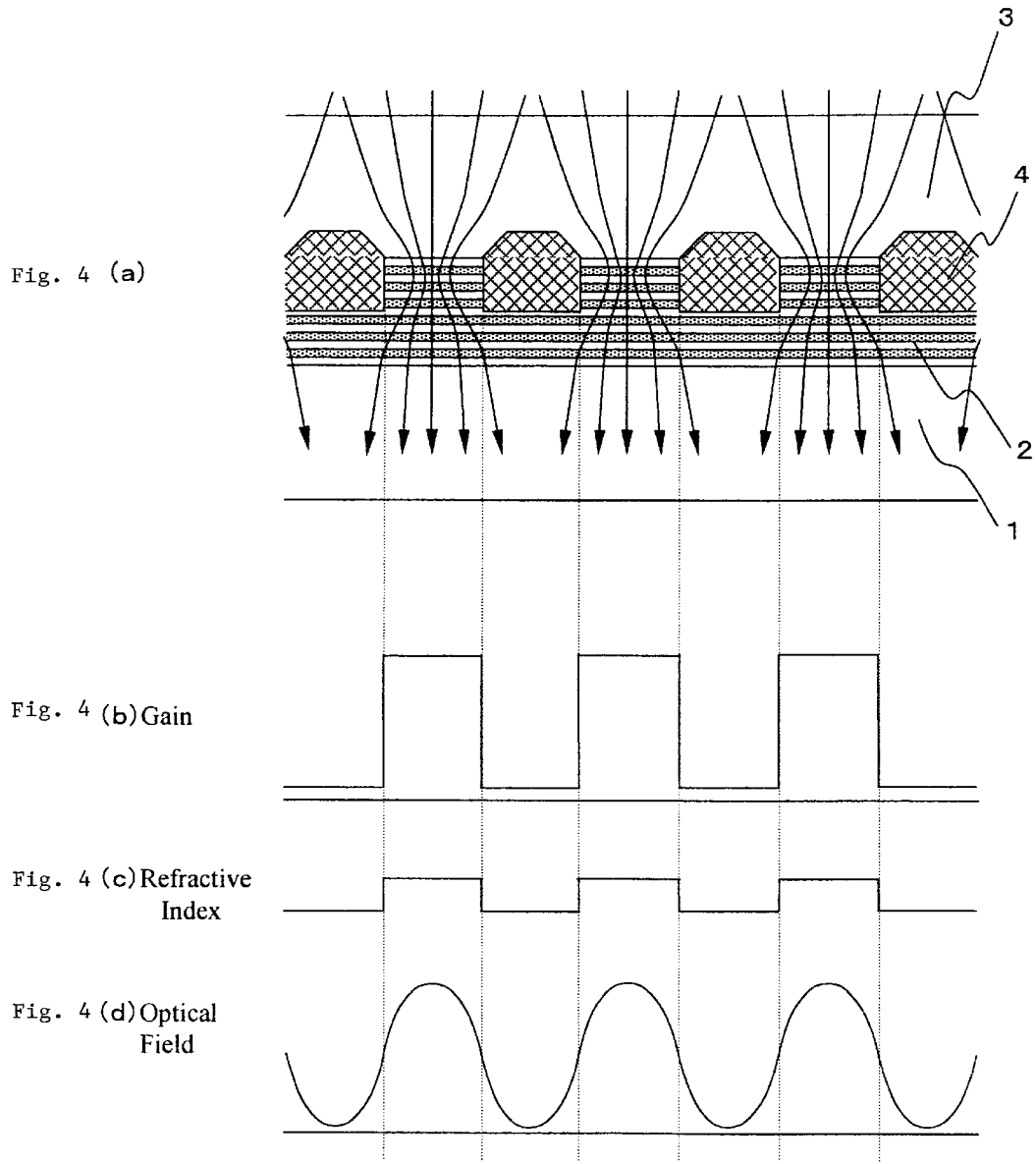
FIGS. 4(a)–4(d) are principle explanatory diagrams of the present invention.

In this figure, the elements like those of FIG. 4 are designated with the like reference numerals. Numeral 5 designates a semiconductor substrate; 6, embedded portions; 7, a cap layer; 8, a p-type electrode; 9, an n-type electrode; and 10, a p-type contact layer.

As illustrated in FIG. 5, in the DFB laser of the first embodiment of the present invention, an n-type InP cladding layer 1 is provided on an n-type InP substrate 5, and an active layer 2 is formed thereon. This active layer 2 has a multiple quantum well (MQW) structure. Upper parts of the multiple quantum well structure are removed using partial etching in the depth direction and thereby the recessed and projected shape causing periodical change of film thickness is formed.

On the recessed regions of the active layer 2, the p-type InP embedded portions 6 and n-type InP current blocking portions 4a are sequentially formed from the active layer side. The p-type InP cap layer 7 is formed on the projected regions of the active layer. Moreover, the p-type InP cladding layer 3 is formed to cover the whole part of the substrate.

As explained above, in the DFB laser of the first embodiment, the n-type InP current blocking portions 4a and p-type InP embedded portions 6 are provided on the recessed regions of the active layer 2 having projected and recessed shape. Therefore the p-n-p-n structure, namely the thyristor structure can be formed of the p-type InP cladding layer 3, n-type current blocking layer 4a, p-type InP embedded layer 6 and n-type InP cladding layer 1. Particularly, a potential barrier due to an inverse bias junction of a diode is formed at the n-p junction interface of the n-type InP current blocking portions 4a and p-type InP embedded portions 6.

This potential barrier blocks a hole in the p-type InP cladding layer 3 flowing into the thin regions (recessed regions) of the active layer 2. Thereby a greater part of the hole current in the p-type InP cladding layer can be injected effectively into the thick regions (projected regions) of the active layer.

Therefore, in the DFB laser of the first embodiment, the ratio of gain coupling to the refractive index coupling is set larger than that of the conventional arts and thereby stability of the single mode oscillation can be improved. Moreover, the oscillation efficiency for the injected current can be improved, and thereby a threshold current can also be lowered than that of the conventional arts.

Next, a method of manufacturing the gain coupled DFB laser of the first embodiment will be explained with reference to FIGS. 6(a) to 8(b).

Here, FIGS. 6(a)–6(c), FIGS. 7(a)–(c) and FIG. 8(b) illustrate the cross-sectional views in the guiding direction of an optical beam of the DFB laser of the first embodiment, and FIG. 5 illustrates the cross-sectional view in the direction perpendicular to the guiding direction of an optical beam.

In the figure, the element like those of FIGS. 1(a) to 1(d) are designated with the like reference numerals. Numeral 11 designates a well layer forming the multiple quantum well layer; 12, a barrier layer forming the multiple quantum well layer; 13, a p-type SCH (Separate Confinement Heterostructure) layer forming the active layer; 14, an n-type SCH layer forming the active layer; 15, a resist film; 16, a dielectric material film consisting of $SiO_2$; 17, a protection film consisting of $SiO_2$; 18, a p-type mesa embedded layer; and 19, an n-type mesa embedded layer.

First, referring to FIG. 6(a), an n-type InP substrate 5 with Sn doping concentration of $2\times10^{18}$ cm$^{-3}$ is used as the growth substrate. An n-type InP cladding layer 1 is grown with Si doping concentration of $1\times10^{18}$ cm$^{-3}$ and thickness of 0.5 m on such n-type InP substrate 5. This growth is performed using TMI (trymethylindium) and $PH_3$ as the growth source and $SiH_4$ as the n-type impurity source, according to the metal organic vapor phase epitaxy (MOVPE) method.

Subsequently, the active layer 2 consisting of the multiple quantum well (MQW) is formed on the n-type InP cladding layer 1. Next a p-type InP cap layer 7 is grown with Zn doping concentration of $5\times10^{17}$ cm$^{-3}$ and thickness of 50 nm on the active layer 2. This growth is performed, according to the MOVPE method, using TMI and $PH_3$ as the growth source and DMZn (dimethyl zinc) as the p-type impurity source.

Moreover, a dielectric material film 16, for example, consisting of SiO2 with thickness of 0.1 m is formed on the p-type InP cap layer 7 according to the sputtering method.

Next, referring to FIG. 6(b), a structure of the active layer 2 will be explained in detail. In this case, the active layer is formed by sequentially stacking, from the side of the n-type InP cladding layer 1, a n-type $In_{0.85}Ga_{0.15}AS_{0.32}P_{0.68}$ SCH layer 14 (composition wavelength is 1.1 m) with Si doping concentration of $5\times10^{17}$ cm$^{-3}$ and thickness of 70 nm, a multiple quantum well layer, and a p-type $In_{0.85}Ga_{0.15}As_{0.32}P_{0.68}$ SCH layer (composition wavelength is 1.1 m) with Zn doping concentration of $5\times10^{17}$ cm$^{-3}$ and thickness of 70 nm.

The multiple quantum well layer (number of well layers is 6, number of barrier layers is 5) is formed by alternately laminating a non-doped $In_{0.75}Ga_{0.25}As_{0.80}P_{0.20}$ well layer 11 (composition wavelength is 1.62 m) with thickness of 5.1 nm and a non-doped $In_{0.78}Ga_{0.22}As_{0.47}P_{0.53}$ barrier layer 12 (composition wavelength is 1.2 m) with thickness of 10 nm.

Here, all layers forming the active layer 2, except for the non-doped $In_{0.75}Ga_{0.25}As_{0.80}P_{0.20}$ well layer 11, are formed with a composition where the lattice matching with the InP substrate 5 occurs. However only the non-doped $In_{0.75}Ga_{0.25}AS_{0.80}P_{0.20}$ well layer 11 is formed with the composition to generate a compressive strain of 0.8%. The active layer 2 is formed of a strained quantum well layer.

Moreover, the InGaAsP layers forming the active layer 2 are all grown using TMI, TMG (trymethyl gallium), $AsH_3$ and $PH_3$ as the growth source and also using $SiH_4$ (n type) and DMZn (p type) as the impurity dopant, according to the MOVPE method.

Next, referring to FIG. 6(c), the $SiO_2$ film 16 is coated with a resist film 15. This surface is patterned using a electron beam exposing method or the two-beam interference exposing method, and then a plurality of apertures with a period of 0.24 m and duty of about 50% is formed.

Subsequently, the $SiO_2$ film 16 is etched, using the resist film 15 having the apertures as the mask, according to a dry etching method using fluoride gas as the etching gas. In this case, the p-type InP cap layer 7 formed on the active layer 2 functions as an etching stopper film to prevent damage for the active layer during the etching process.

Figure 7A:
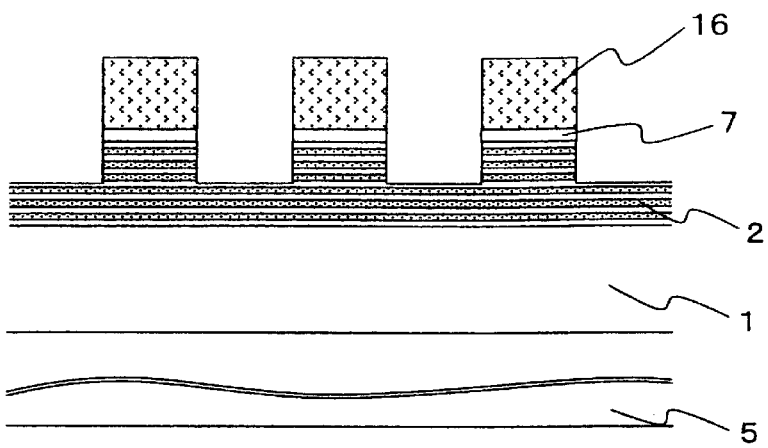
FIGS. 7(a)–7(c) are second cross-sectional views along the guiding direction of an optical beam for explaining the manufacturing process of the DFB laser according to the first embodiment of the present invention.

Next, referring to FIG. 7(a), after removing the resist film, the active layer 2 is etched, using the patterned $SiO_2$ film 16 as the mask, according to a reactive ion etching (RIE) method using ethane, hydrogen and oxygen as the etching gas. The etching depth is defined as 0.1 m. In this case, the etching is performed up to an intermediate region of the active layer under the control that at least a part of the active layer 2 is left unetched in the side of n-type InP cladding layer.

Thereby, the thick regions and thin regions are periodically formed in the active layer 2 and the projected and recessed shape with a period of 0.24 m is formed.

The InP cap layer 7 is etched simultaneously on the occasion of etching the active layer 2 and is removed from a surface of the active layer.

Figure 7B:
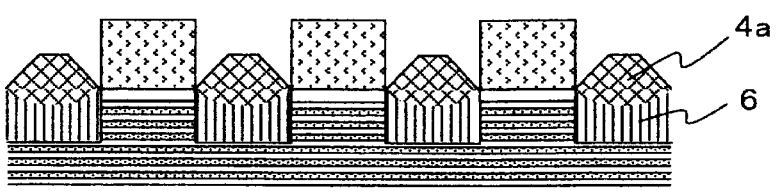

Referring to FIG. 7(b), the p-type InP embedded portions 6 is selectively grown with Zn doping concentration of $1\times10^{18}$ cm$^{-3}$ on the recessed surfaces of the active layer 2 formed in the process of FIG. 4(d). This growth is performed using the patterned $SiO_2$ film as the mask according to the MOVPE method. TMI and $PH_3$ is used as the growth source and DMZn is used as the p-type impurity source.

In this case, the bottom surface and side surface of the recessed region are selectively covered with the p-type InP so that the thickness from the bottom surface becomes 0.08 m at the thinnest part.

Subsequently, in the same manner, the n-type InP current blocking portions 4a are selectively grown with Si doping concentration of $7 \times 10^{18}$ cm$^{-3}$ on the p-type InP embedded portions 6. This growth is performed according to the MOVPE method using the SiO$_2$ film as the mask. TMI and PH3 is used as the growth source and SiH$_4$ is used as the n-type impurity source.

In this selective growth process, since the InP does not grow at surfaces of the SiO2 mask 16, the n-type InP current blocking portions 4a grow in the projected shape that becomes highest around the center of the recessed region of the active layer 2. This growth is performed under the control that the height of the most upper part of the current blocking portions 4a becomes 0.17 m from the bottom surfaces of the recessed regions.

Figure 7C:
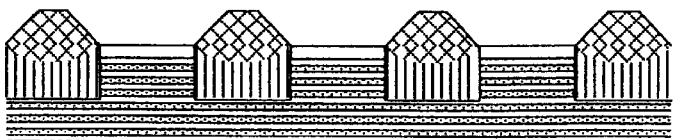

Next, referring to FIG. 7(c), the SiO$_2$ mask 16 is removed using the buffered hydrofluoric acid. Subsequently, in order to make the surface flat, the p-type InP cladding layer 3 is grown over the entire surface of the substrate with Zn doping concentration of 1 10$^{18}$ cm$^{-3}$ and thickness of 0.5 m. This growth is performed using TMI and PH3 as the growth source and DMZn as the p-type impurity source according to the MOVPE method.

Figure 8A:
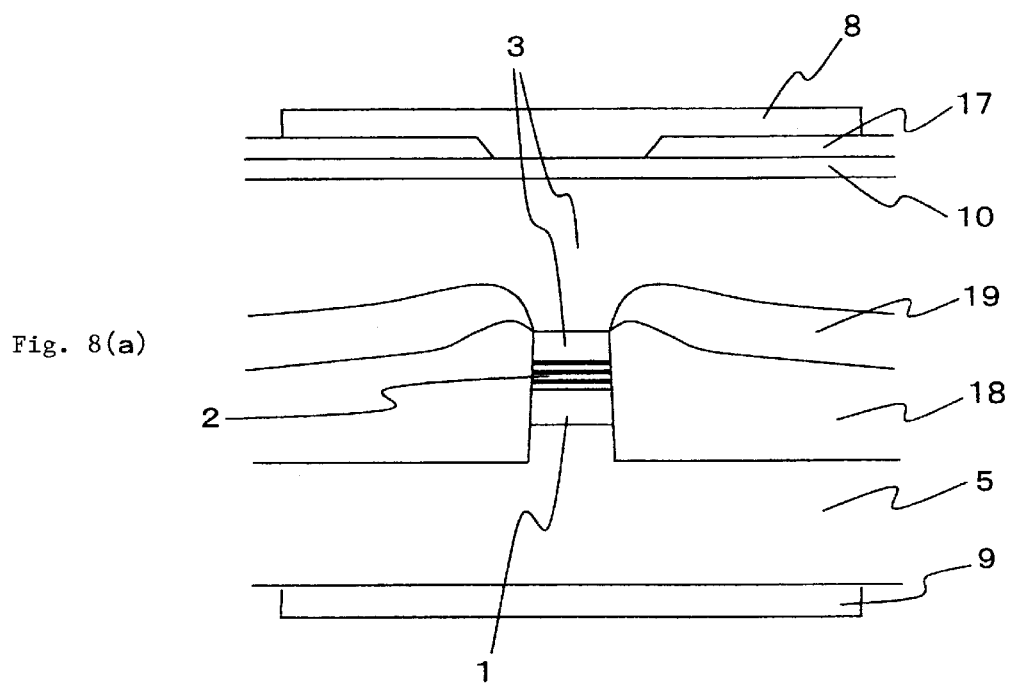
FIGS. 8(a)–8(b) are third cross-sectional views along the guiding direction of an optical beam for explaining the manufacturing process of the DFB laser according to the first embodiment of the present invention.
Figure 8B:
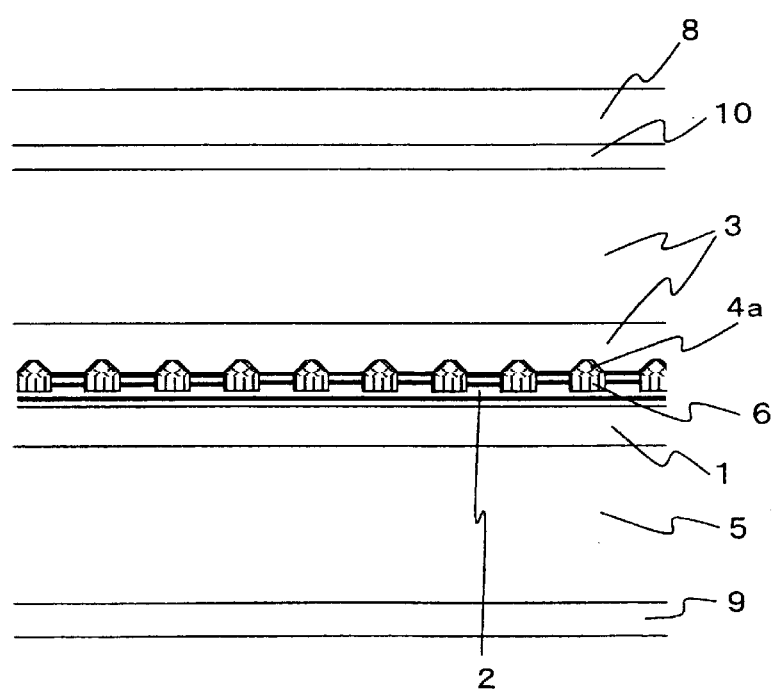

Next, referring to FIGS. 8(a) and 8(b), the substrate grown up to the step of FIG. 7(c) is then processed into the mesa stripe shape with a width of about 1.5 m. This mesa stripe shape is along the direction of the distribution of the projected and recessed surfaces of the active layer 2, namely the guiding direction of an optical beam. (Refer to FIG. 5(a).) Thereafter, the p-type InP burying layer 18 with Zn doping concentration of $5 \times 10^{17}$ cm$^{-3}$ and the n-type InP burying layer 19 with Si doping concentration of $7 \times 10^{17}$ cm$^{-3}$ are sequentially formed in the side regions of the mesa stripe. Thereby, a current blocking structure including the p-n junction is formed.

Next, the p-type InP cladding layer with Zn doping concentration of $1 \times 10^{18}$ cm$^{-3}$ is grown again using the same method of FIG. 7(c) on the n-type InP burying layer 19 and the p-type cladding layer 3.

Moreover, the p-type In$_{0.53}$Ga$_{0.47}$As contact layer 10 (composition wavelength is 1.2 m) with Zn doping concentration of $1 \times 10^{19}$ cm$^{-3}$ is grown on the p-type InP cladding layer 3.

Subsequently, a protection film 17 consisting of SiO$_2$ is formed on the p-type InGaAs contact layer 10 and thereafter an aperture for contact is then formed at the position corresponding to the top area of the mesa stripe. A p-type electrode 8 consisting of Ti/Pt/Au is formed in the side of the p-type InP cladding layer 3. Meanwhile an n-type electrode 9 consisting of Au/Ge/Au is formed in the side of the n-type InP cladding layer 1.

Finally, the DFB laser can be cut out with the resonator length of 300 m by cleavage of the substrate in the direction perpendicular to the mesa stripe direction. Thereby, the gain coupled DFB laser of the first embodiment of the present invention can be formed.

Figure 9:
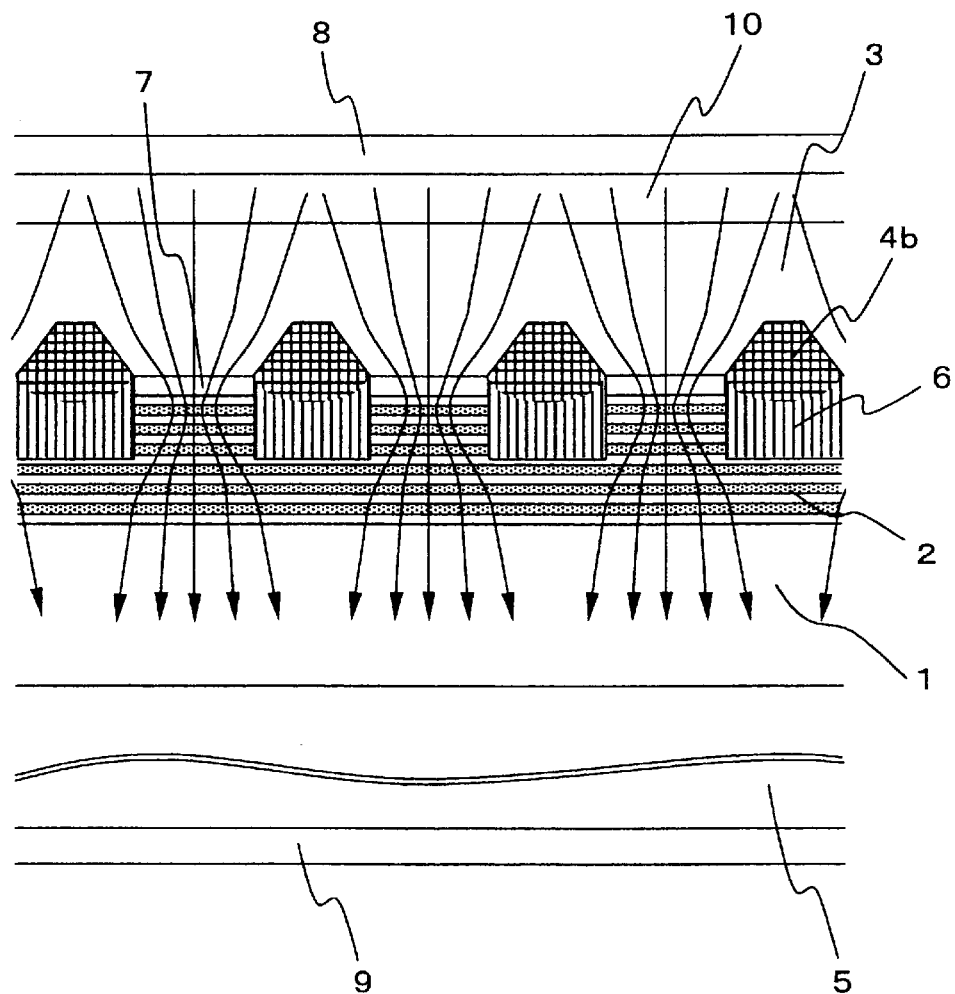
FIG. 9 is a cross-sectional view in the direction along the guiding direction of an optical beam of the gain coupled DFB laser according to the second embodiment of the present invention.

FIG. 9 is a schematic diagram of the second embodiment of the present invention, illustrating a cross-sectional view of the gain coupled DFB laser. In the figure, the elements like those of FIGS. 1(a) to 1(d) and FIGS. 2(a) to 2(d) are designated with the like reference numerals.

The DFB laser of the second embodiment of FIG. 9 has a structure that is almost equal to that of the first embodiment. However, it is different in the point that the n-type current blocking portions 4a are formed of InGaAsP, although it is formed of InP in the first embodiment. InGaAsP is a quaternary compound semiconductor having a band gap smaller than that of InP, namely having a larger refractive index.

In more detail, in the second embodiment of FIG. 9, the n-type In$_{0.78}$Ga$_{0.22}$As$_{0.47}$P$_{0.53}$ current blocking portions 4b (composition wavelength is 1.2 m) with Si doping concentration of $7 \times 10^{18}$ cm$^{-3}$ is formed over the recessed region of the active layer 2.

With the structure explained above, it is possible to enlarge the average refractive index of the semiconductors embedded on the recessed regions of the active layer 2, namely of the n-type current blocking portions 4b and p-type embedded portions 6, in comparison with that of the first embodiment. Therefore, the difference of the average refractive indices of the semiconductors embedded on the recessed regions and the semiconductors included in the projected regions can be reduced.

Therefore, the amplitude of the refraction index distribution for the guiding direction of an optical beam can be reduced and thereby the refractive index coupling can be reduced in comparison with that of the first embodiment.

Accordingly, in the DFB laser of the second embodiment, the ratio of the gain coupling to the refractive index coupling can further be reduced in comparison with that of the first embodiment. Therefore, the stability of the single mode oscillation of the laser can further be improved.

Moreover, in the DFB laser of the second embodiment, the n-p junctions consisting of the n-type current blocking portions 4b and p-type embedded portions 6 can be formed of the p-type InP layer 6 and the n-type In$_{0.78}$Ga$_{0.22}$As$_{0.47}$P$_{0.53}$ layer 4b. The n-type In$_{0.78}$Ga$_{0.22}$As$_{0.47}$P$_{0.53}$ has a band gap that is smaller than that of InP.

Therefore, a potential barrier of an inverse bias junction generated at the n-p junction interface can be set higher than that of the first embodiment. Thereby, in the DFB laser of the second embodiment, the blocking effect for a hole current can be further improved over that in the first embodiment.

Therefore, the ratio of the gain coupling to the refractive index coupling is enlarged in comparison with that of the conventional arts and stability of the single mode oscillation of the laser can further be improved. Oscillation efficiency for the injected current is improved and a threshold current can further be lowered.

Next, the method of manufacturing the DFB laser of the second embodiment will be explained. The method of manufacturing the DFB laser of the second embodiment is almost similar to that of the first embodiment. However these methods are different only in the process that the n-type InP current blocking portions 4a of FIG. 7(b) is formed.

Namely, in the second embodiment, the n-type In$_{0.78}$Ga$_{0.22}$As$_{0.47}$P$_{0.53}$ current blocking portions 4b with Si doping concentration of $7 \times 10^{18}$cm$^{-3}$ is selectively grown, in place of the n-type InP current blocking portions 4a, on the p-type InP embedded portions 6. This growth is performed using TMI, TMG, AsH$_4$ and PH$_3$ as the growth source and SiH$_4$ as the n-type impurity source according to the MOVPE method.

The p-type InP embedded portions 6 are formed on the recessed surfaces of the active layer 2. The height of the most upper surface of the projected region is set to 0.17 m from the bottom surface of the recessed region.

The DFB laser of the third embodiment of the present invention has a structure almost similar to that of the second embodiment of FIG. 9. However there is a difference in such a point that a composition of the n-type InGaAsP current blocking portions 4b in the second embodiment is adjusted so that the average refractive index of the n-type InGaAsP current blocking portions 4b and p-type InP embedded portions 6 becomes substantially equal to that of the projected regions of the active layer 2.

In more detail, in the third embodiment, the n-type $In_{0.69}Ga_{0.31}As_{0.66}P_{0.34}$ current blocking portions 4b (composition wavelength is 1.34 m) with Si doping concentration of $7 \times 10^{18}$ cm$^{-3}$ is formed over the recessed region of the active layer 2. (Refer to FIG. 9.) In this case, a difference between the average refractive index of the projected regions of the active layer 2 and that of semiconductors embedded on the recessed regions are eliminated. Namely a difference between the average refractive index of the projected regions and that of the n-type current blocking portions 4b and p-type embedded portions 6 are eliminated. Thereby, the element of the refractive index coupling can substantially be eliminated.

Therefore, the ratio of the gain coupling to the refractive index coupling can further be increased and thereby stability of the single mode oscillation of the laser can further be improved.

The method of manufacturing the DFB laser of the third embodiment is almost similar to that of the second embodiment. Therefore, the same explanation will be omitted here.

Figure 10:
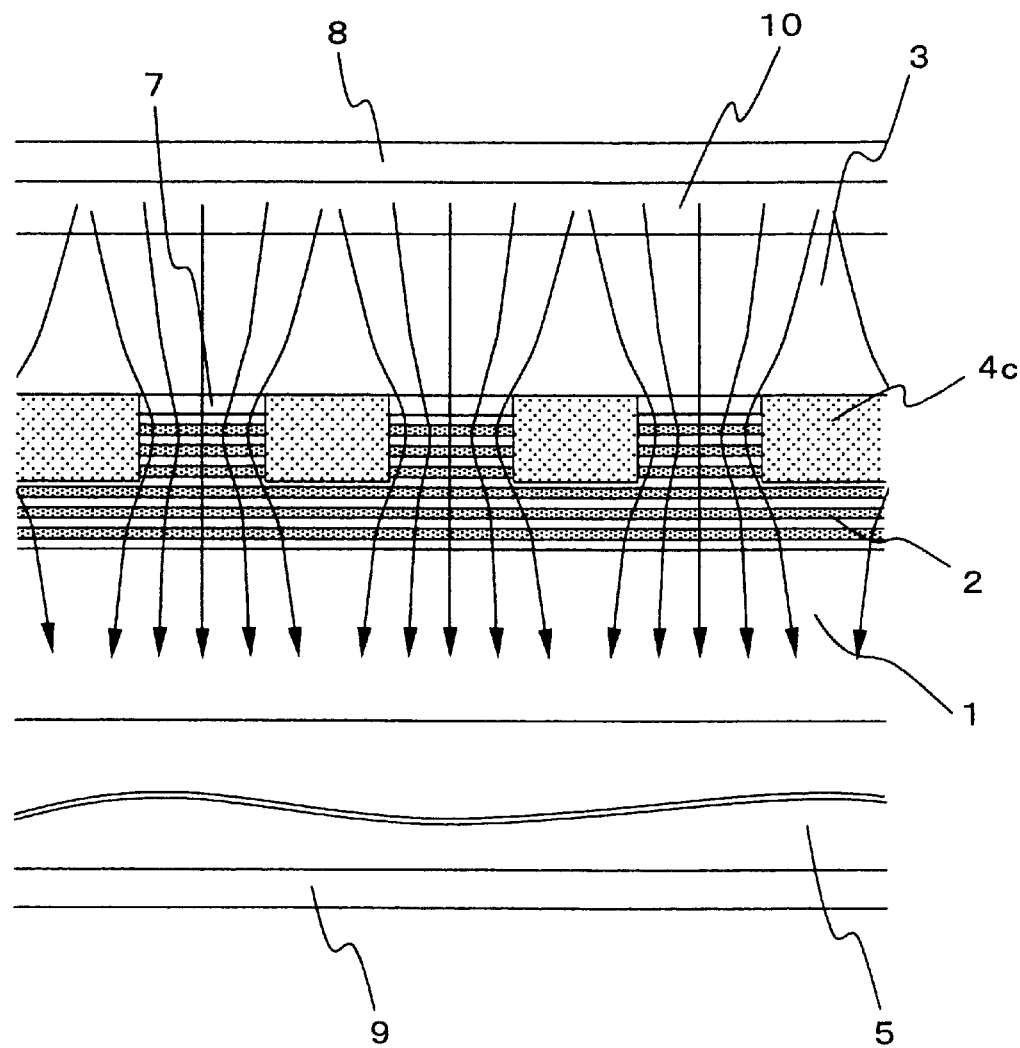
FIG. 10 is a cross-sectional view in the direction along the guiding direction of an optical beam of the gain coupled DFB laser according to the fourth embodiment of the present invention.

FIG. 10 is a schematic diagram of the fourth embodiment of the present invention, illustrating the cross-sectional view of the gain coupled DFB laser. The elements like those of FIGS. 4(a) to 4(d) and FIG. 5 are designated with the like reference numerals.

The DFB laser of the fourth embodiment of FIG. 10 has a structure that is almost similar to that of the first embodiment of FIGS. 4(a) to 4(d). However it is different in the point that the recessed regions of the active layer 2 are fully embedded with only n-type InGaAsP, although the n-p junction is formed of the n-type InP current blocking portions 4a and the p-type InP embedded portions 6 on the recessed regions in the first embodiment. N-type InGaAsP is a quaternary compound semiconductor having a band gap larger than that of InP, namely having a larger refractive index.

In more detail, in the fourth embodiment of the present invention, the recessed regions of the active layer 2 are embedded with the n-type $In_{0.72}Ga_{0.28}As_{0.61}P_{0.39}$ current blocking portions 4c (composition wavelength is 1.3 m) with Si doping concentration of $7 \times 10^-$cm$^{-3}$.

With the structure explained above, in the DFB laser of the fourth embodiment, the $In_{0.72}Ga_{0.28}As_{0.61}P_{0.39}$ current blocking portions 4c having a n-type conductivity against the p-type InP cladding layer 3 is embedded over the recessed region. Therefore, a potential barrier having sufficient height for a hole current in comparison with the DFB laser of the third conventional art can be formed at the junction interface between the p-type cladding layer 3 and n-type current blocking portions 4c.

A hole current is blocked by this potential barrier and can be guided into the thick regions (projected region) of the active layer 2.

In comparison with the first to third embodiments, the current blocking effect explained above is small. However, since the InP embedded portions 6 is not formed in the fourth embodiment, the fourth embodiment can provide the blocking effect to a hole current according to more a simplified device structure in comparison with that of the first to third embodiments.

Moreover, the DFB laser of the fourth embodiment can further reduce the element of refractive index coupling. Because a difference between the average refractive index of the projected regions and that of the semiconductors embedded on the recessed regions of the active layer 2 can be reduced. Namely, a difference between the average refractive index of the projected regions and that of the n-type current blocking layer 4c can also be reduced as in the case of the second embodiment.

Accordingly, the ratio of the gain coupling to the refractive index coupling can further be increased and stability of the single mode oscillation of the laser can also further be increased in comparison with that in the first embodiment.

Next, the method of manufacturing the DFB laser of the fourth embodiment will be explained. The method of manufacturing the DFB laser of the fourth embodiment is almost similar to that of the first embodiment. However, it is different only in the process to forming the p-type InP embedded portions 6 and the n-type InP current blocking portions 4a, illustrated in FIG. 7(b).

Namely, in the fourth embodiment, the n-type $In_{0.72}Ga_{0.28}As_{0.61}P_{0.39}$ current blocking portions 4c with Si doping concentration of $7 \times 10^{18}$ cm$^{-3}$ is grown, in place of the p-type InP embedded portions 6 and n-type InP current blocking portions 4a. This growth is performed using TMI, TMG, AsH$_4$ and PH$_3$ as the growth source and SiH4 as the n-type impurity source according to the MOVPE method. The n-type $In_{0.72}Ga_{0.28}As_{0.61}P_{0.39}$ is selectively grown on the recessed regions of the active layer 2 to fill in a flat depression of the recessed regions.

Here, in the fourth embodiment explained above, while the current blocking portions 4c embedded on the recessed regions is formed of the n-type InGaAsP, it may also be formed of the n-type InP.

In this case, the refractive index of the semiconductors layer embedded on the recessed regions of the active layer 2 becomes equal to that of the first embodiment. Therefore, a difference between the average refractive index of the projected regions of the active layer 2 and that of the semiconductors embedded on the recessed regions cannot be reduced as much as the first embodiment.

Therefore, the refractive index coupling cannot be reduced as much as the first embodiment. However, it is possible to attain the effect that the blocking effect for a hole current can be obtained using a more simplified device structure in comparison with that of the first to third embodiments.

The DFB laser of the fifth embodiment of the present invention also has a structure almost similar to that of the fourth embodiment of FIG. 10. However, it is different in the point that a composition of the n-type InGaAsP current blocking portions 4c of the fourth embodiment is adjusted so that the refractive index thereof becomes substantially equal to the average refractive index of the projected regions.

In more detail, in the fifth embodiment, the recessed region of the active layer is embedded with the n-type $In_{0.85}Ga_{0.15}As_{0.32}P_{0.68}$ current blocking portion 4c (composition waveform is 1.1 m) with Si doping concentration of $7 \times 10^{18}$ cm$^{-3}$. (Refer to FIG. 10.)

In this case, as in the case of the third embodiment, a difference between the average refractive index of the projected regions of the active layer 2 and the refractive index of the n-type $In_{0.85}Ga_{0.15}As_{0.32}P_{0.68}$ embedded on the recessed regions can be eliminated. Thereby the element of refractive index coupling can substantially be eliminated.

Therefore the ratio of the gain coupling to the refractive index coupling can further be enlarged and thereby the stability of the single mode oscillation of the laser can further be improved.

The method of manufacturing the DFB laser of the fifth embodiment is almost similar to that of the second embodiment. Therefore, the same explanation is omitted here.

The DFB laser of the sixth embodiment of the present invention has a structure similar to that of the second embodiment. However, the sixth embodiment is different in the point that a composition of the n-type InGaAsP current blocking portions 4b of the second embodiment is adjusted so that a band gap thereof becomes smaller than that corresponding to a Bragg wavelength determined by a period of distribution of the projected and recessed shape of the active layer 2.

In more detail, in the sixth embodiment, the n-type $In_{0.56}Ga_{0.44}As_{0.95}P_{0.05}$ current blocking portions 4b (composition wavelength is 1.6 m) with Si coping concentration of $7'10^{18}$ cm$^{-3}$ is formed over the recessed region of the active layer 2. (Refer to FIG. 9.)

With the structure explained above, the n-type $In_{0.56}Ga_{0.44}As_{0.95}P_{0.05}$ current blocking portions 4b works as a material for absorbing optical beams for the oscillation wavelength of the laser. Therefore, the gain of the thin regions (recessed regions) of the active layer 2 just under such current blocking portions 4b can effectively be reduced.

Accordingly, the amplitude of the gain distribution in the guiding direction of an optical beam can be set larger in comparison with that of the second embodiment. Therefore the ratio of the gain coupling to the refractive index coupling can further be enlarged, and thereby stability of the single mode oscillation of laser can further be improved.

The method of manufacturing the DFB laser of the sixth embodiment is almost similar to that of the second embodiment, and the same explanation will be omitted here.

Here, in the sixth embodiment explained above, the n-type InGaAsP current blocking portions 4b of the second embodiment is used as a material for absorbing optical beams for the oscillation wavelength of the laser with adjustment of the composition thereof. In the fourth embodiment the n-type InGaAsP current blocking portions 4c can also be used as a material for absorbing optical beams for the oscillation wavelength by adjusting the composition thereof. In this case, the effect similar to that of the sixth embodiment can also be attained.

Moreover, in the first to sixth embodiments explained above, a composition and thickness of each well layer 11 are kept equal in the multiple quantum well structure of the active layer, but such equalization is not always required.

In the case that the active layer is provided with the multiple quantum well structure including strained quantum well layers as in the case of the first to sixth embodiments, the lattice relaxation occurs in the quantum well layers of the projected regions when the active layer 2 is processed to form the projected and recessed regions using the etching process as illustrated in FIG. 7(a). Thereby, it is probable that a peak wavelength wherein the gain is obtained shifts to a short wavelength side in the quantum well layers of the projected regions.

Therefore, in view of compensating for such shift, it is also possible, on the occasion of growing the multiple quantum well structure of FIG. 6(b), that if well layers 11 form the projected regions after subsequent etching process, a composition of the above well layers 11 can be adjusted beforehand so that a peak wavelength thereof is shifted to a long wavelength side than that of well layers which form the recessed regions.

Moreover, in the first to the sixth embodiments, thickness of the multiple quantum well layer forming the active layer 2 is equalized in the guiding direction of an optical beam, but the present invention is never limited thereto. For example, the multiple quantum well layer can be tapered gradually in the guiding direction of an optical beam. In this case, it is possible to form the tapered waveguide type DFB laser and thereby the spot size of an optical beam can generally be changed as the optical beam is guided.

Moreover, in the DFB laser of the first to sixth embodiments, the current blocking effect can be attained by forming an n-p junction of the n-type current blocking portions, or n-type current blocking portions and the p-type embedded portions on the recessed region of the active layer. However, the present invention is not limited thereto and any type of structure for realizing the current blocking effect can be used. For example, the current blocking portions can be formed of a material having a small electrical conductivity in comparison with the p-type cladding layer such as insulators and high resistance materials.

Moreover, it is of course possible that the DFB laser of the first to sixth embodiments is integrated with an optical device having a function other than light emission. For example, the DFB laser of the first to sixth embodiments can be formed by integration with an optical modulator, optical amplifier or the like.

Moreover, in the DFB laser of the first to sixth embodiments, the DFB laser that oscillates in the 1.55 m band using the InP substrate has been explained, but the present invention is never limited thereto. Of course the present invention can be adapted to a laser using the other semiconductor substrate such as a GaAs substrate or to the laser that oscillates in the other wavelength range.

As explained above, the DFB laser of the present invention has a structure comprising: a first cladding layer; a second cladding layer having a conductivity type opposing to that of said first cladding layer; an active layer sandwiched between said first cladding layer and said second cladding layer, having periodically projected and recessed surfaces and having thickness which periodically changes, and; current blocking portions formed on said recessed surfaces of said active layer for pinching a current flowing into said first and second cladding layer in order to selectively guide the current through the projected surfaces of said active layer.

With the structure explained above, the present invention can periodically change thickness of the active layer in the guiding direction of an optical beam and selectively injects a greater part of the injected current to the thick regions (projected regions) of the active layer on the occasion of injecting current to the active layer from external sides and thereby extremely reduce the amount of current to be injected to the thin regions (recessed regions) of the active layer.

Therefore, since the ratio of the gain coupling to the refractive index coupling can be increased more than that of the conventional arts and thereby the stability of single mode oscillation of the laser can further be improved. Moreover, oscillation efficiency for the injected current can be improved and thereby a threshold current can also be lowered than that of the conventional arts.

Accordingly, the present invention can provide much contribution to improvement of performance of a distributed feedback semiconductor laser and particularly of a gain coupled distributed feedback semiconductor laser.

While the present invention has been described in reference to a specific embodiment, the scope of the invention is not limited to that embodiment and is deemed to include the scope as set out in the appended claimed and their equivalents.

What is claimed is:

1. A distributed feedback semiconductor laser comprising:
   a first cladding layer;
   a second cladding layer having a conductivity type opposing that of said first cladding layer;
   an active layer sandwiched between said first cladding layer and said second cladding layer, having periodically projected and recessed surfaces and having thickness which periodically changes; and
   current blocking portions formed on said recessed surfaces of said active layer for pinching a current flowing into said first and second cladding layers in order to selectively guide the current through the projected surfaces of said active layer.

2. The distributed feedback semiconductor laser according to claim 1, wherein said current blocking portions are comprised of a semiconductor layer having a band gap that is smaller than that of said first cladding layer and said second cladding layer.

3. The distributed feedback semiconductor laser according to claim 1, wherein a composition of a semiconductor layer forming said current blocking portions is determined so that an average refractive index of a semiconductor layer forming said current blocking portions is substantially equal to that of a projected region of said active layer.

4. The distributed feedback semiconductor laser according to claim 1, wherein said current blocking portions are comprised of a semiconductor layer having a band gap that is smaller than that corresponding to a Bragg wavelength which is determined by a period of recessed and projected regions of said active layer.

5. The distributed feedback semiconductor laser according to claim 1, wherein said current blocking portions are the same material as that of said first cladding layer and said second cladding layer.

6. The distributed feedback semiconductor laser according to claim 1, wherein said current blocking portions are the quarternary compound semiconductor material.

7. The distributed feedback semiconductor laser according to claim 1, wherein said active layer comprises a first well layer extending over projected and recessed regions of said active layer and a second well layer included within said projected regions, and a composition of a semiconductor forming said second layer is determined so that a peak wavelength of said second layer is shifted to a long wavelength side in comparison with that of that of said first layer.

8. The distributed feedback semiconductor laser according to claim 1, wherein said active layer includes multiple quantum well layers, and thickness of said multiple quantum well layers is tapered.

9. A distributed feedback semiconductor laser comprising:
   a first cladding layer;
   a second cladding layer having a conductivity type opposite to that of said first cladding layer;
   an active layer sandwiched between said first cladding layer and said second cladding layer, having periodically projected and recessed surfaces, and having thickness which periodically changes;
   current blocking portions formed on said recessed surfaces of said active layer and having a conductivity type opposing that of one of said first and second cladding layer formed in the side of said projected and recessed surfaces, said current blocking portions pinching a current flowing into said first and second cladding layer in order to selectively guide the current through the projected surfaces of said active layer,
   embedded potions formed between said current blocking portions and said recessed surfaces and having a conductivity type opposing to that of said current blocking portions.

10. The distributed feedback semiconductor laser according to claim 9, wherein said current blocking portions are comprised of a semiconductor layer having a band gap that is smaller than that of said first cladding layer and said second cladding layer.

11. The distributed feedback semiconductor laser according to claim 9, wherein a composition of a semiconductor layer forming said current blocking portions is determined so that an average refractive index of semiconductor layers forming said current blocking portions and said embedded potions is substantially equal to that of a projected region of said active layer.

12. The distributed feedback semiconductor laser according to claim 9, wherein said current blocking potions are comprised of a semiconductor layer having a band gap that is smaller than that corresponding to a Bragg wavelength which is determined by a period of recessed and projected regions of said active layer.

13. A distributed feedback semiconductor laser comprising:
   a first cladding layer;
   a second cladding layer having a conductivity type opposing that of said first cladding layer;
   an active layer sandwiched between said first cladding layer and said second cladding layer, having periodically projected and recessed surfaces, and having thickness which periodically changes, and;
   current blocking potions formed on said recessed surfaces of said active layer and having a conductivity type opposing to that of one of said first and second cladding layer formed in the side of said projected and recessed surfaces, said current blocking portions pinching a current flowing into said first and second cladding layer in order to selectively guide the current through the projected surfaces of said active layer.

14. The distributed feedback semiconductor laser according to claim 13, wherein said current blocking portions are comprised of a semiconductor layer having a band gap that is smaller than that of said first cladding layer and said second cladding layer.

15. The distributed feedback semiconductor laser according to claim 13, wherein a composition of a semiconductor layer forming said current blocking portions is determined so that an average refractive index of a semiconductor layer forming said current blocking portions is substantially equal to that of a projected region of said active layer.

16. A distributed feedback semiconductor laser according to claim 13, wherein said current blocking layer is comprised of a semiconductor layer having a band gap that is smaller than that corresponding to a Bragg wavelength which is determined by a period of recessed and projected regions of said active layer.

* * * * *